US011360116B2

(12) United States Patent
Yu

(10) Patent No.: US 11,360,116 B2
(45) Date of Patent: Jun. 14, 2022

(54) TESTING DEVICE WITH POWER PROTECTION AND ITS TESTING PLATFORM

(71) Applicant: CHENBRO MICOM CO., LTD., New Taipei (TW)

(72) Inventor: Cheng-Han Yu, New Taipei (TW)

(73) Assignee: CHENBRO MICOM CO., LTD., New Taipei (TW)

( * ) Notice: Subject to any disclaimer, the term of this patent is extended or adjusted under 35 U.S.C. 154(b) by 0 days.

(21) Appl. No.: 17/238,221

(22) Filed: Apr. 23, 2021

(65) Prior Publication Data

US 2021/0341514 A1 Nov. 4, 2021

(30) Foreign Application Priority Data

Apr. 30, 2020 (TW) ................................. 109114638

(51) Int. Cl.
*G01R 1/04* (2006.01)
(52) U.S. Cl.
CPC ................................. *G01R 1/0408* (2013.01)
(58) Field of Classification Search
CPC .................................................. G01R 1/0408
See application file for complete search history.

(56) References Cited

U.S. PATENT DOCUMENTS

| 9,124,044 | B2 | 9/2015 | Beldock et al. | |
| 2010/0291781 | A1* | 11/2010 | Lee | G06F 1/1632 |
| | | | | 439/259 |
| 2013/0260582 | A1 | 10/2013 | White | |
| 2016/0356814 | A1* | 12/2016 | Larisch | G01R 1/04 |
| 2019/0107868 | A1* | 4/2019 | Hung | G06F 1/182 |

FOREIGN PATENT DOCUMENTS

| CN | 1825511 A | 8/2006 |
| TW | 308323 U | 6/1997 |
| TW | 471311 U | 1/2002 |
| TW | 201040551 A | 11/2010 |
| TW | M497847 U | 3/2015 |
| TW | M598583 U | 7/2020 |

* cited by examiner

*Primary Examiner* — Paresh Patel
(74) *Attorney, Agent, or Firm* — CKC & Partners Co., LLC

(57) ABSTRACT

A testing device with power protection includes a power interface and a testing platform. The testing platform includes a casing, a fixed frame and a sliding frame. The power interface is disposed at one surface of the casing. The fixed frame covers the power interface. One side of the fixed frame formed with an entrance that exposes the power interface outwards from the fixed frame. The sliding frame includes a rack body slidably that is located on the casing, and a shielding door that is rotatably connected to the rack body for covering the entrance of the fixed frame. When the rack body is slid towards the power interface so as to rotate the shielding door away from the entrance by the fixed frame, the power interface is exposed outwards from the fixed frame through the entrance.

20 Claims, 11 Drawing Sheets

TESTING DEVICE WITH POWER PROTECTION AND ITS TESTING PLATFORM

RELATED APPLICATIONS

This application claims priority to Taiwan Application Serial Number 109114638, filed on Apr. 30, 2020, which is herein incorporated by reference.

BACKGROUND

Field of Disclosure

The present disclosure relates to a testing device. More particularly, the present disclosure relates to a testing device with power protection and its testing platform.

Description of Related Art

When an existing test platform tests a product under test (e.g., server unit), the product under test is physically plugged into a power interface of the test platform so as to obtain power from the test platform.

However, the power interface exposed outwards from the test platform will not only get dust or foreign objects, but also lead the maintenance personnel to be injured by accidentally touching the power interface.

Therefore, the above-mentioned method still has inconveniences and shortcomings, which needs to be further improved. Therefore, how to effectively solve the above-mentioned inconveniences and shortcomings is one of the current essential research and development topics, and it has also become an urgent need for improvement in related fields.

SUMMARY

One aspect of the present disclosure is to provide a testing device with power protection and its testing platform to solve the aforementioned problems of the prior art.

In one embodiment of the present disclosure, the testing device includes a power supply module and a testing platform. The power supply module is provided with a power interface. The testing platform includes a casing, a fixed frame and a sliding frame. The power interface is disposed at one surface of the casing. The fixed frame receives the power interface therein. One side of the fixed frame is formed with an entrance that is able to expose the power interface outwards from the fixed frame. The sliding frame includes a rack body that is slidably located on the casing, and a shielding door that is rotatably connected to the rack body for covering the entrance of the fixed frame. Thus, when the rack body is slid towards the power interface so that the shielding door is pushed to rotate away from the entrance by the fixed frame, the power interface is exposed outwards from the fixed frame through the entrance.

According to one or more embodiments of the present disclosure, in the testing device, a through channel is collectively formed by the rack body and the casing, and the entrance of the fixed frame is disposed within the through channel.

According to one or more embodiments of the present disclosure, in the testing device, the shielding door includes a door plate and two pivotal portions. The door plate is disposed within the through channel, covers the entrance of the fixed frame, and is pivotally connected to the rack body through the pivotal portions, respectively.

According to one or more embodiments of the present disclosure, in the testing device, the shielding door further includes a torsion spring. The torsion spring is located on one of the pivotal portions, and connected to the door plate and the rack body so as to provide a resilience force capable of moving the door plate to be rotated back to the entrance of the fixed frame.

According to one or more embodiments of the present disclosure, in the testing device, the rack body further includes a top plate portion and two side plate portions. The side plate portions are respectively disposed on two opposite sides of the top plate portion and extend in a common direction. Each of the side plate portions is fixedly connected to the surface of the casing, and the top plate portion facing towards the surface of the casing. The through channel is defined by the top plate portion, the side plate portions and the surface of the casing, collectively. The door plate is pivotally connected to the side plate portions through the pivotal portions, respectively, so that the door plate is rotatable about a rotary axis that is perpendicular to the common direction.

According to one or more embodiments of the present disclosure, in the testing device, the rack body further includes a pivoting bracket, a top plate portion and two side plate portions. The side plate portions are respectively disposed on two opposite sides of the top plate portion and extend in a common direction. Each of the side plate portions is fixedly connected to the surface of the casing, and the top plate portion facing towards the surface of the casing. The through channel is defined by the top plate portion, the side plate portions and the surface of the casing, collectively. The pivoting bracket is disposed within the through channel, and connected to one of the side plate portions. The door plate is pivotally connected to the top plate portion and the one side plate portion through the pivotal portions, respectively, so that the door plate is rotatable about a rotary axis that is parallel to the common direction.

According to one or more embodiments of the present disclosure, in the testing device, the shielding door further includes a load. The load is located at one end of the door plate facing away from the pivotal portions so as to provide a gravity force capable of pulling downwardly the door plate to rotate back to the entrance of the fixed frame.

According to one or more embodiments of the present disclosure, in the testing device, the casing includes a sliding rail portion that is disposed on the surface of the casing. The sliding frame includes a sliding rib that is disposed on the rack body and slidably engaged with the sliding rail portion.

According to one or more embodiments of the present disclosure, in the testing device, the casing includes a linear groove formed on the surface of the casing. The sliding frame includes a connecting post and a tension spring. The connecting post is connected to the rack body and slidably received within the linear groove. The tension spring is connected to the connecting post and the casing so as to provide a resilience force capable of pushing the rack body away from the power interface.

According to one or more embodiments of the present disclosure, the testing device further includes a bottom case assembled to one side of the casing facing away from the fixed frame, and the bottom case is formed with a receiving space therein for receiving the power supply module. The surface of the casing is formed with an opening located inside the fixed frame, and the power interface extends into the fixed frame through the opening from the receiving space.

According to one or more embodiments of the present disclosure, in the testing device, the power supply module further includes a power circuit and a trigger switch. The power circuit is disposed within the receiving space. The trigger switch is electrically connected to the power circuit and the power interface, and extends into the fixed frame through the opening from the receiving space. When the shielding door is pushed away from the entrance and the trigger switch is triggered at the same time, the power circuit starts to be electrically connected to the power interface.

In one embodiment of the present disclosure, the testing platform includes a casing, a fixed frame and a sliding frame. The casing is used to place a power interface. The fixed frame receives the power interface. One side of the fixed frame formed with an entrance that is able to expose the power interface outwards from the fixed frame. The sliding frame includes a rack body slidably that is located on the casing, and a shielding door that is rotatably connected to the rack body for covering the entrance of the fixed frame. Thus, when the rack body is slid towards the power interface so that the shielding door is pushed to rotate away from the entrance by the fixed frame, the power interface is exposed outwards from the fixed frame through the entrance.

Thus, through the construction of the embodiments above, not only the power connector of the server unit can smoothly connect to the power interface of the testing device, but also the possibilities of dust or foreign objects entering the power interface of the testing platform can be decreased, and the possibilities of the maintenance personnel to be injured by accidentally touching the power interface can be reduced.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
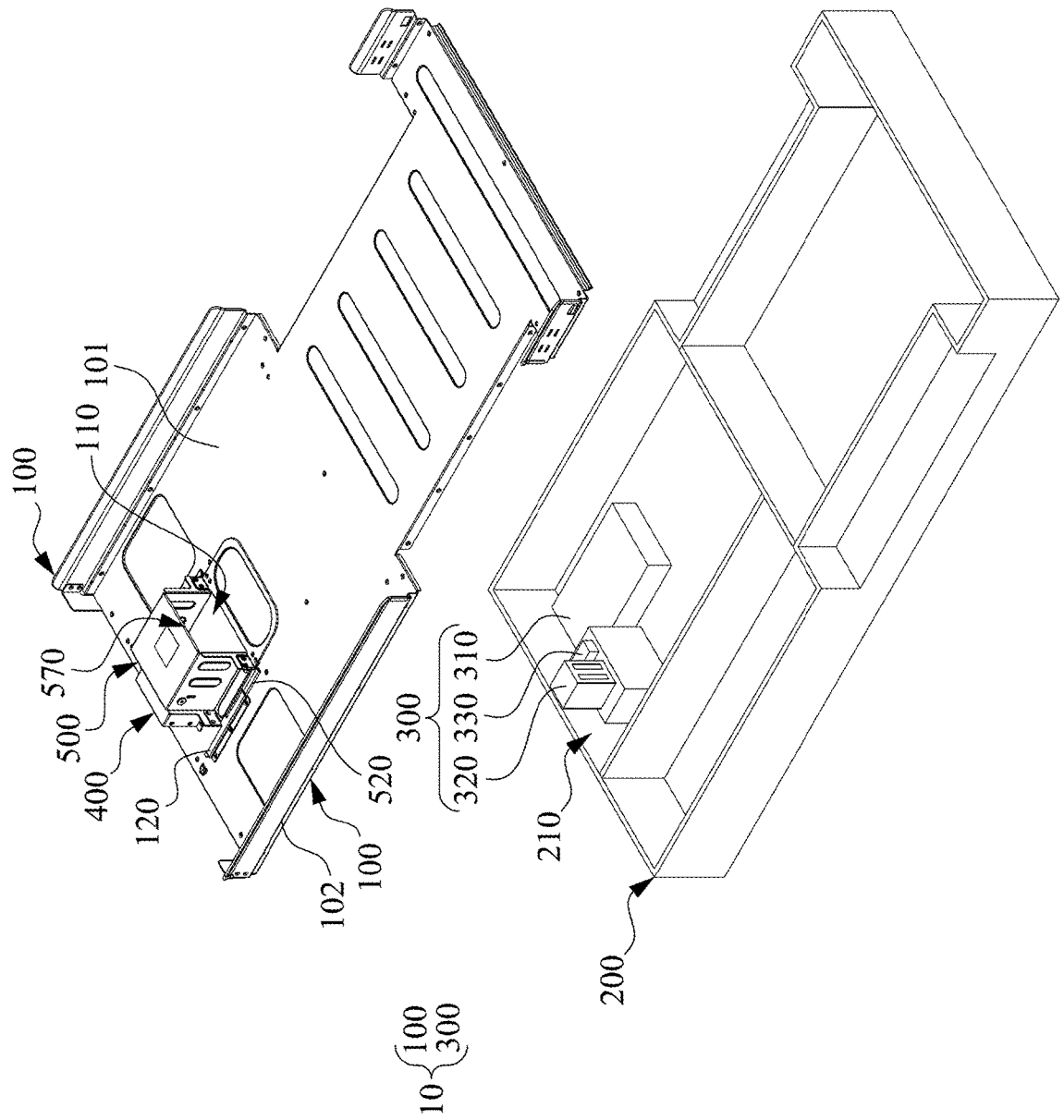
FIG. 1 is an exploded view of a testing device with power protection according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 2:
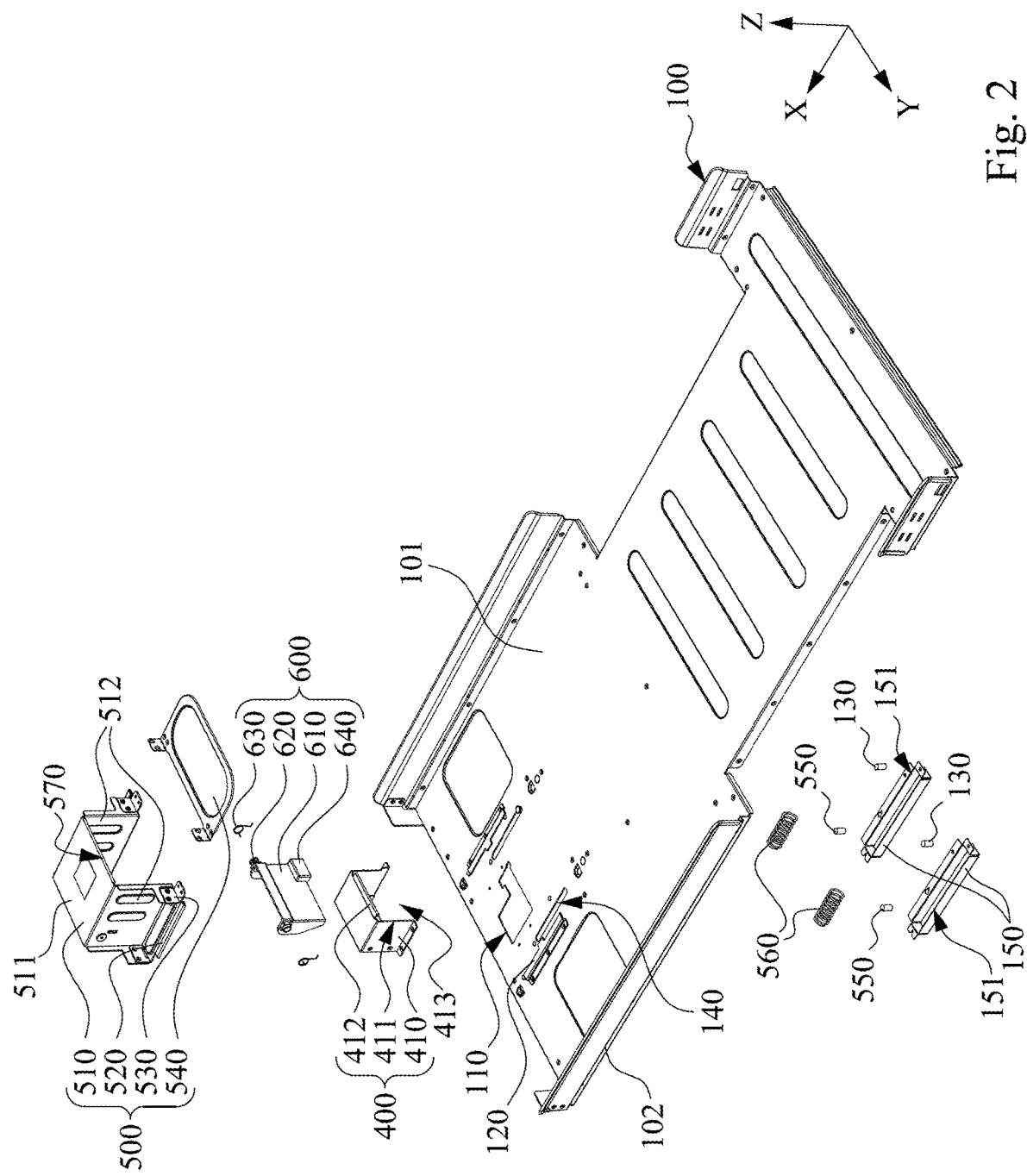
FIG. 2 is an exploded view of the testing platform of FIG. 1.
Figure 3:
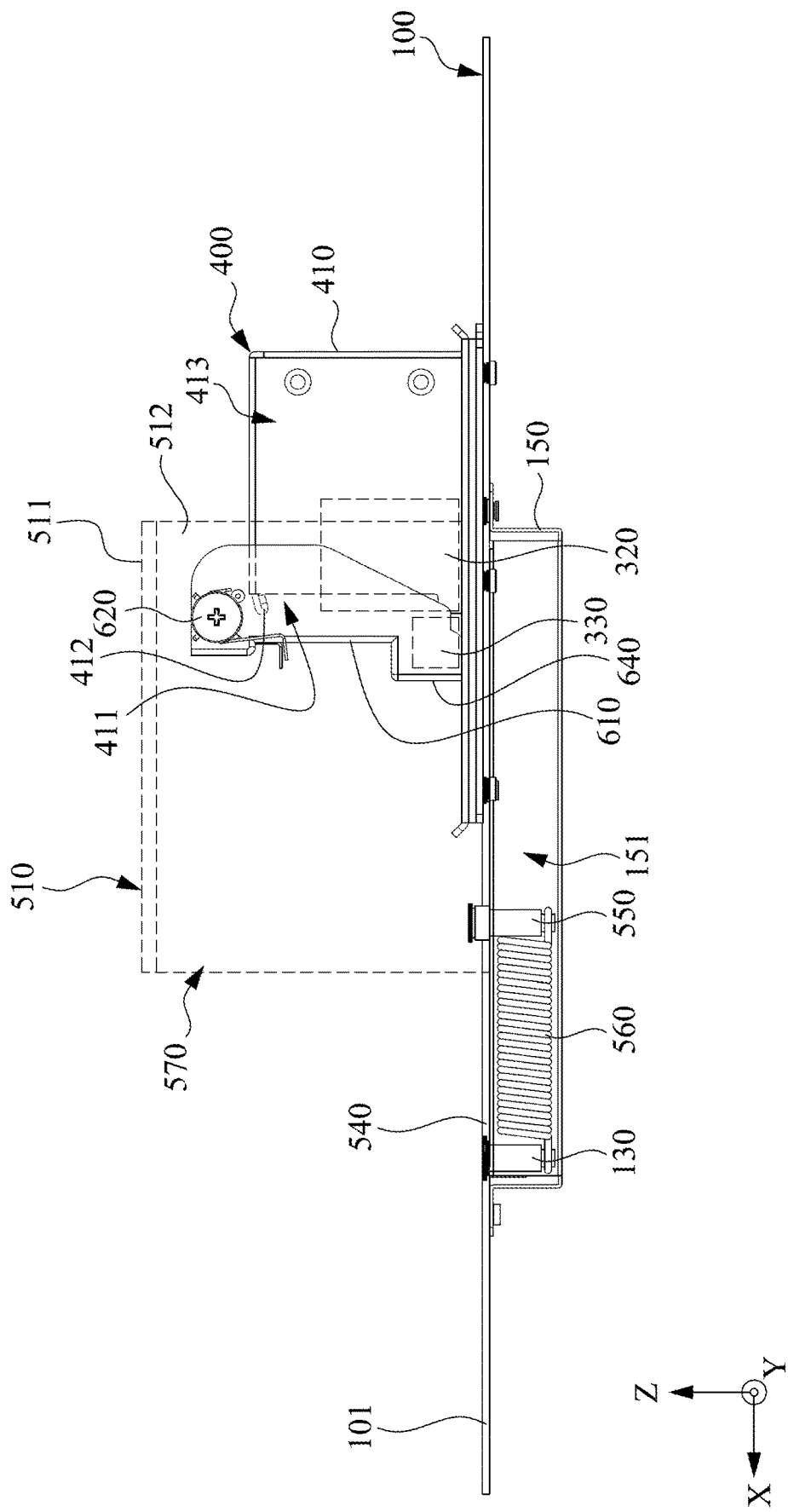
FIG. 3 is a schematic side view of the testing platform of FIG. 1.

Reference is now made to FIG. 1 to FIG. 3, in which FIG. 1 is an exploded view of a testing device 1 with power protection according to one embodiment of the present disclosure, FIG. 2 is an exploded view of the testing platform 10 of FIG. 1 and FIG. 3 is a schematic side view of the testing platform 10 of FIG. 1. As shown in FIG. 1 to FIG. 3, the testing device 1 includes a testing platform 10 and a power supply module 300. The testing platform 10 includes a casing 100, a bottom case 200, a fixed frame 400 and a sliding frame 500. The bottom case 200 is formed with a receiving space 210 at one side thereof. The bottom case 200 and the casing 100 are assembled to each other for covering the receiving space 210. The power supply module 300 is disposed on the bottom case 200 within the receiving space 210. The power supply module 300 further includes a power circuit 310 and a power interface 320. The power circuit 310 is disposed within the receiving space 210. The power interface 320 extends to one outer surface (called top surface 101 hereinafter) of the casing 100 facing away from the receiving space 210, and is electrically connected to the power circuit 310 located within the receiving space 210 for providing electrical power for the externals. The fixed frame 400 is fixedly disposed on the top surface 101 of the casing 100 to cover the power interface 320.

In this embodiment, the fixed frame 400 includes a frame body 410 and an entrance 411. The frame body 410 is formed with a receiving space 413 therein, and the receiving space 413 receives the power interface 320 therein. The entrance 411 is formed on one side of the frame body 410, is in communication with the receiving space 413, and is allowed to expose the power interface 320 outwards from the fixed frame 400. The sliding frame 500 includes a rack body 510 and a shielding door 600. The rack body 510 is slidably located on the top surface 101 of the casing 100. The shielding door 600 is rotatably connected to the rack body 510 for covering the frame body 410 and the entrance 411 of the fixed frame 400.

It is noted, the rack body 510 of the sliding frame 500 in FIG. 3 is shown in dashed lines so as to show the shielding door 600 and a part of the fixed frame 400 by seeing through the rack body 510.

More specifically, a cross section of the rack body 510 is in a U-shape, and a through channel 570 is formed between the rack body 510 and the casing 100. The shielding door 600 is located within the through channel 570, and a part of the fixed frame 400 is located within the through channel 570, and the entrance 411 of the fixed frame 400 is located within the through channel 570. Furthermore, the rack body 510 includes a top plate portion 511 and two side plate portions 512. The side plate portions 512 are respectively disposed on two opposite sides of the top plate portion 511 and extend in a common direction (e.g., axis Z). Each of the side plate portions 512 is fixedly connected to the casing 100, and the top plate portion 511 faces towards the top surface 101 of the casing 100. The aforementioned through channel 570 is defined by the top plate portion 511, the side plate portions 512 and the top surface 101 of the casing 100, collectively.

The casing 100 includes two sliding rail portions 120. The sliding rail portions 120 are spaced arranged on the top surface 101 of the casing 100. The sliding frame 500 includes two sliding ribs 520. The sliding ribs 520 are respectively disposed on two opposite sides of the rack body 510, and extend apart with each other along two opposite directions. The sliding ribs 520 are respectively disposed on the rack body 510 and slidably engaged with the sliding rail portions 120. Thus, through the engagement of the sliding ribs 520 and the sliding rail portions 120 with each other, the sliding frame 500 can linearly slide relative to the casing 100 along a sliding direction (e.g., X axis).

In addition, the casing 100 includes two first connecting posts 130, two linear grooves 140 and two shielding covers 150. The linear grooves 140 are spaced arranged on the top surface 101 of the casing 100. The first connecting posts 130 are spaced and fixed on another outer surface (called rear surface 102 hereinafter) of the casing 100 facing away from the fixed frame 400. The sliding frame 500 further includes two second connecting posts 550 and two tension springs 560. Each of the second connecting posts 550 is formed on one of the sliding ribs 520 of the sliding frame 500, and extends towards the receiving space 210. Each of the second connecting posts 550 is slidably located within one of the linear grooves 140. Two opposite ends of each of the tension springs 560 are respectively connected to one of the first connecting posts 130 and one of the second connecting posts 550. Thus, when the sliding frame 500 is slid towards the power interface 320 relative to the casing 100, the sliding frame 500 is able to stretch both of the tension springs 560, so that each of the tension springs 560 respectively provides a resilient force for pushing the rack body 510 away from the power interface 320. Each of the shielding covers 150 covers the rear surface 102 of the casing 100, and is provided with a travelled space 151 therein. Each of the first connecting posts 130, each of the tension springs 560 and each of the second connecting posts 550 are collectively located within the travelled space 151 of one of the shielding covers 150, and the second connecting post 550 is able to be reciprocated within the travelled space 151.

The sliding frame 500 includes two bending ribs 530 and a loading plate 540. The bending ribs 530 are respectively located at two opposite sides of the rack body 510 facing away from the power interface 320, and each of the bending ribs 530 is bent outwardly. The loading plate 540 is placed on the top surface 101 of the casing 100, and fixedly connected to the aforementioned opposite sides of the rack body 510 facing away from the power interface 320. Each of the bending ribs 530 is connected to the loading plate 540 and one of the sliding ribs 520.

In the embodiment, for example, the shielding door 600 includes a door plate 610 and two pivotal portions 620. The door plate 610 is disposed within the through channel 570 to cover the entrance 411 of the fixed frame 400. The door plate 610 is pivotally connected to the rack body through the pivotal portions 620, respectively. The pivotal portions 620 are respectively located at two opposite sides of the door plate 610, and are pivotally connected to the inner surfaces of the side plate portions 512 of the rack body 510. The axis direction of the pivotal portions 620 (e.g., Y axis) and the sliding direction (e.g., X axis) are perpendicular to each other so that the axis direction of the pivotal portions 620 (e.g., Y axis) passes through the side plate portions 512. Therefore, the door plate 610 is able to rotate about the axis direction (e.g., Y axis) of the pivotal portions 620.

Thus, because the shielding door 600 is located within the through channel 570 to cover the entrance 411 of the fixed frame 400, dust or foreign objects will not easily enter the power interface of the testing platform, and the power interface will not be accidentally touched by maintenance personnel, thereby the possibilities of the maintenance personnel being electrically shocked can be reduced.

In addition, the shielding door 600 further includes at least one torsion spring 630. The torsion spring 630 is located on one of the pivotal portions 620, and connected to the door plate 610 and the rack body 510 so as to provide a resilience force for moving the door plate 610 to be rotated back to the entrance 411 of the fixed frame 400.

The present disclosure is not limited to this, in other embodiments, the shielding door 600 further includes a load (not shown in figures). The load is located at one end of the door plate 610 facing away from the pivotal portions 620 so as to provide a gravity force capable of pulling downwardly the door plate 610 to be rotated back to the entrance 411 of the fixed frame 400. However, the load and the torsion spring are not essential components in the present disclosure.

In this embodiment, the fixed frame 400 includes a flange 412. The flange 412 is protrusively extended outwardly from the side (e.g., the top portion) of the fixed frame 400 to the shielding door 600 in the through channel 570. However, as long as the shielding door 600 can be pushed to be rotated by the flange 412, the present disclosure is not limited to the shape of the flange 412.

The power supply module 300 further includes a trigger switch 330. The trigger switch 330 is electrically connected to the power circuit 310 located within the receiving space 210. The trigger switch 330 is disposed next to the power interface 320, and the trigger switch 330 is closer to the shielding door 600 (or the loading plate 540) than the power interface 320 when the shielding door 600 covers the entrance 411 of the fixed frame 400. Thus, when the trigger switch 330 is pressed, the power circuit 310 starts to be electrically connected to the power interface 320. In other words, when the trigger switch 330 is not pressed, the maintenance personnel will not be electrically shocked by the power interface 320. For example, the trigger switch 330 is a micro-switch or similar components.

The shielding door 600 further includes a sunken portion 640. The sunken portion 640 is located at one end of the door plate 610 facing away from the pivotal portions 620, and recessed in a direction facing away from the power interface 320 for accommodating the trigger switch 330 when the shielding door 600 covers the entrance 411 of the fixed frame 400.

Also, the top surface 101 of the casing 100 is formed with an opening 110. The opening 110 is in communication with the receiving space 210 and the receiving space 413, and faces towards the top plate portion 511 in the fixed frame 400. Therefore, both of the trigger switch 330 and the power interface 320 extend into the receiving space 413 of the fixed frame 400 from the receiving space 210 along a vertical direction (e.g., Z axis) through the opening 110.

In addition, the bottom case 200 may also be provided with foot pads or pulleys for facilitating the placement or movement of the testing platform 10, however, the present disclosure is not limited to this.

Figure 4A:
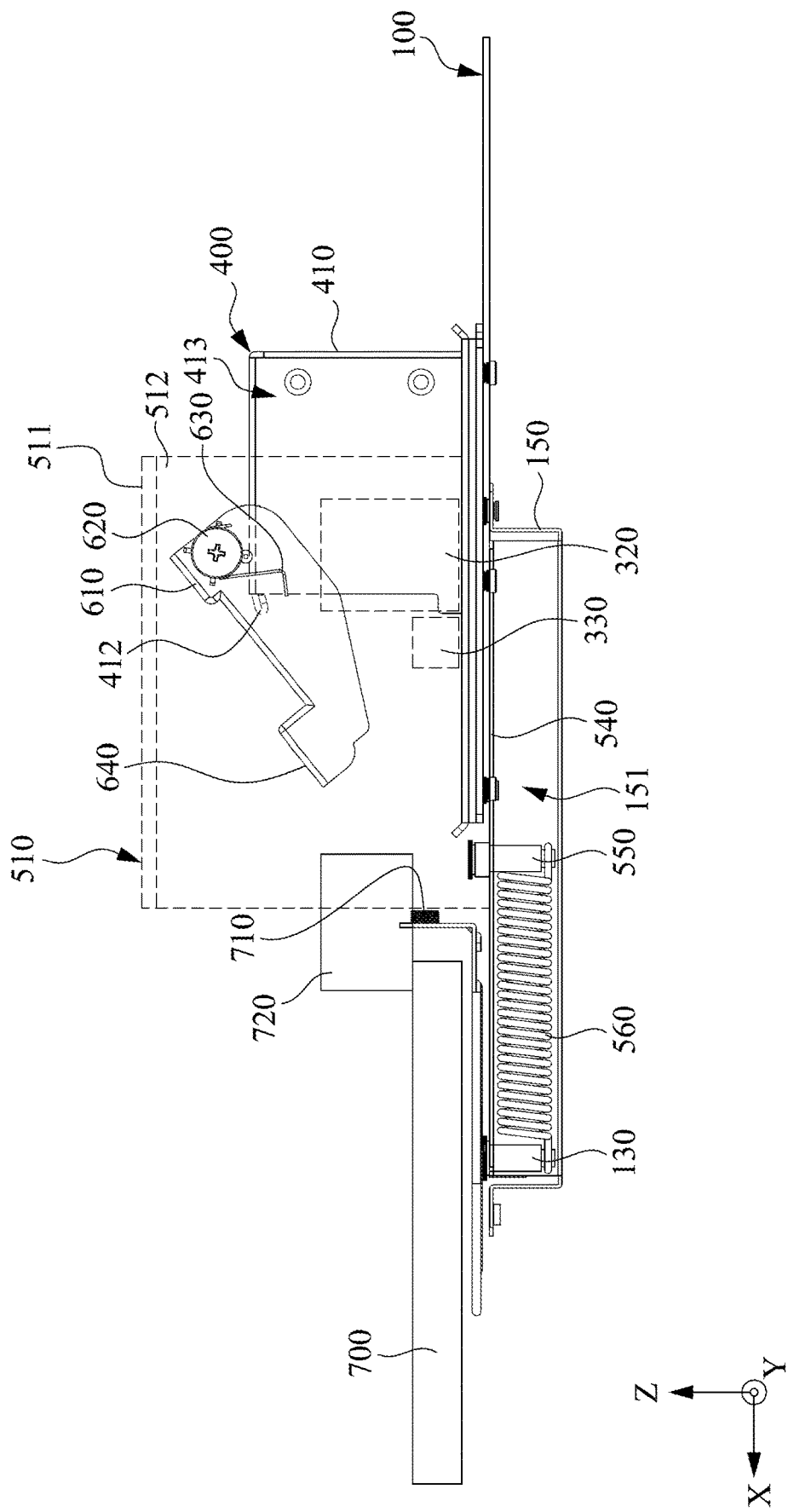
FIG. 4A and FIG. 4B are continuing operational views of the testing platform of FIG. 1.
Figure 4B:
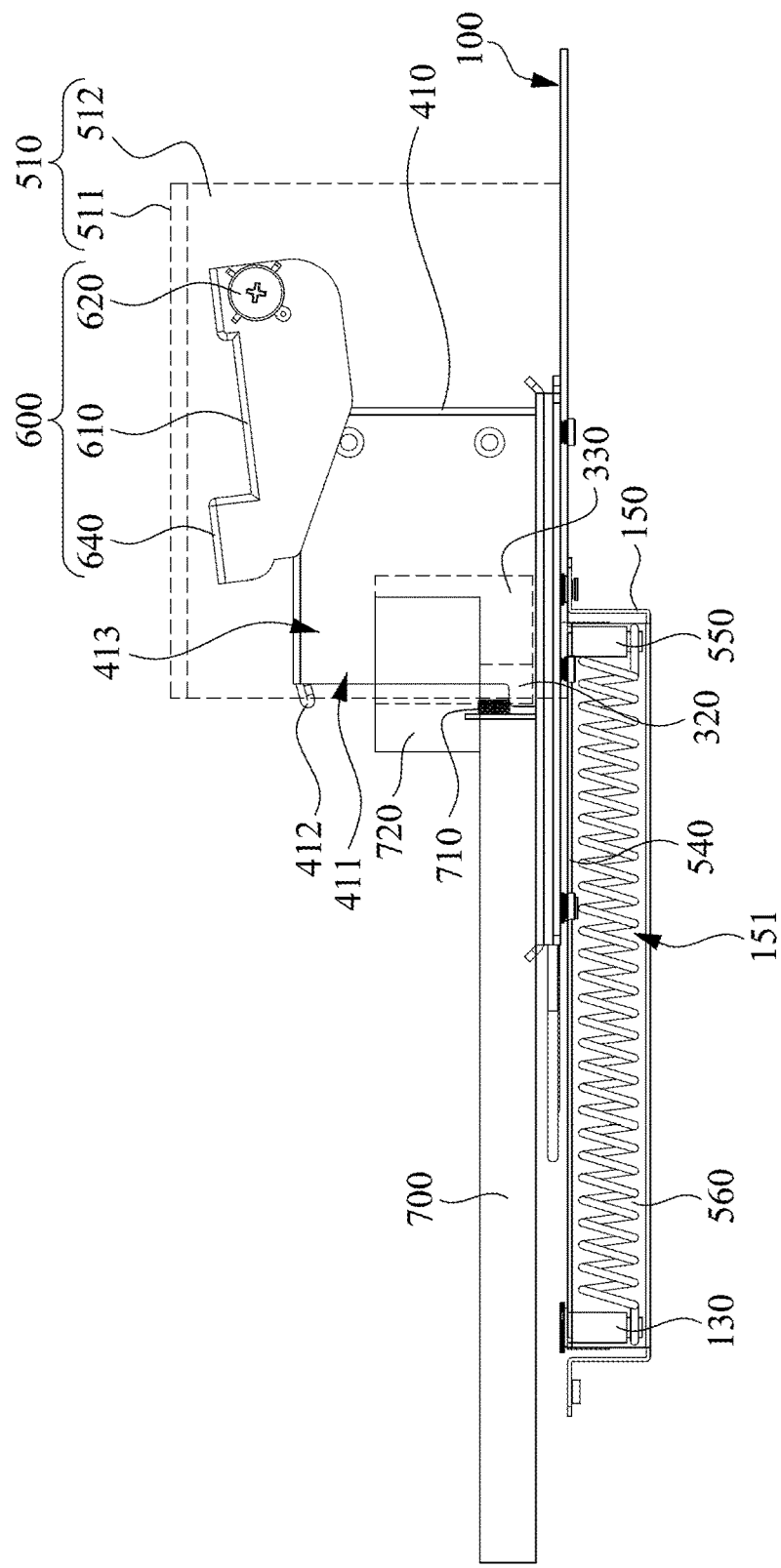
Figure 5:
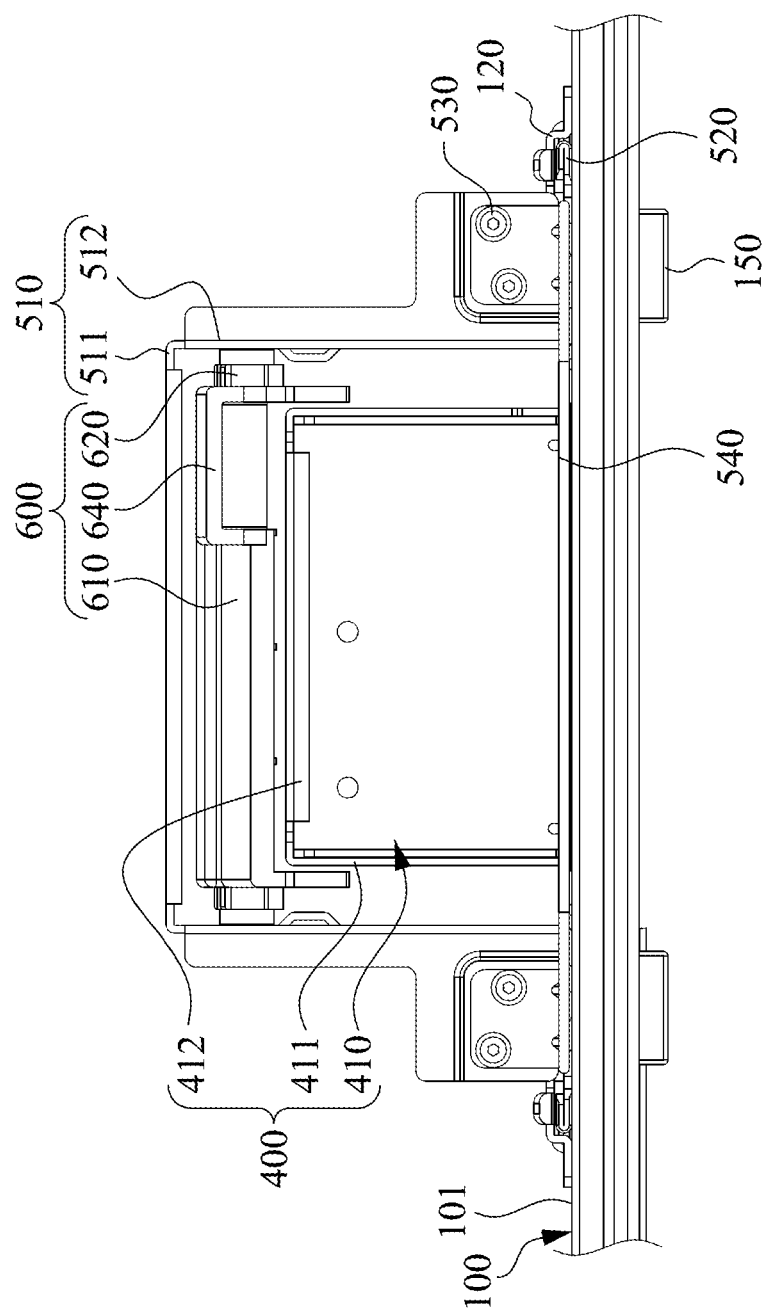
FIG. 5 is a front view of FIG. 4B.

FIG. 4A and FIG. 4B are continuing operational views of the testing platform 10 of FIG. 1. FIG. 5 is a front view of FIG. 4B. As shown in FIG. 3 and FIG. 4A, after a device under test 700 (e.g., server unit) is placed on the loading plate 540 of the sliding frame 500 and slid towards the power interface 320, a power connector 720 of the device under test 700 begins to enter the through channel 570, and next, a front edge 710 of the device under test 700 begins to slide the sliding frame 500 along the sliding direction (e.g., X axis) by pushing the bending ribs 530 of the sliding frame 500.

As shown in FIG. 4A, when the door plate 610 rotates upwardly about the axis direction of the pivotal portions 620 (e.g., Y axis) as the door plate 610 is pushed by the fixed frame 400, the end of the door plate 610 facing away from the pivotal portions 620 begins to leave away from the entrance 411 of the fixed frame 400, so that the power interface 320 located in the fixed frame 400 is gradually exposed outwards from the entrance 411.

As shown in FIG. 4B and FIG. 5, when the fixed frame 400 is completely located in the sliding frame 500, and the shielding door 600 is rotated to be arranged between the fixed frame 400 and the sliding frame 500, the shielding door 600 completely exposes the power interface 320 in the fixed frame 400 through the entrance 411. Therefore, the power connector 720 of the device under test 700 is able to plug into the power interface 320 in the fixed frame 400 for receiving power supply from the power circuit 310.

In this embodiment, since the front edge 710 of the device under test 700 presses the trigger switch 330 first, when the power connector 720 of the device under test 700 plugs into the power interface 320 in the fixed frame 400, the power circuit 310 starts to provide power supply to the power connector 720 through the power interface 320.

It is noted, when the device under test 700 is withdrawn from the fixed frame 400, the resilient force of the tension springs 560 pushes the sliding frame 500 away from the power interface 320, and the resilience force of the torsion spring 630 rotates the door plate 610 downwardly to the entrance 411 of the fixed frame 400 about the axis direction of the pivotal portions 620 (e.g., Y axis) for next test to another device under test 700.

Figure 6:
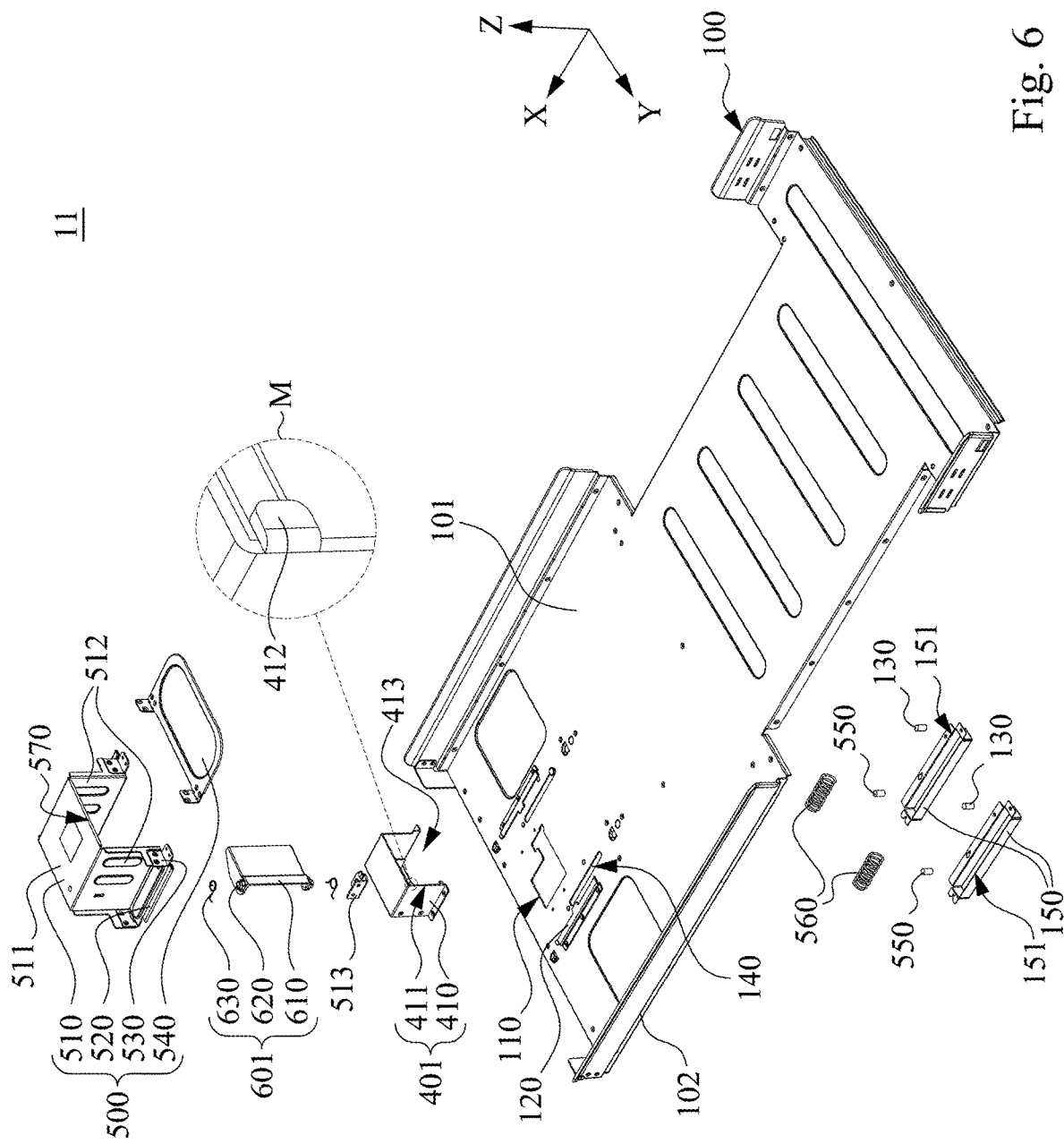
FIG. 6 is an exploded view of a testing platform according to another embodiment of the present disclosure.
Figure 7A:
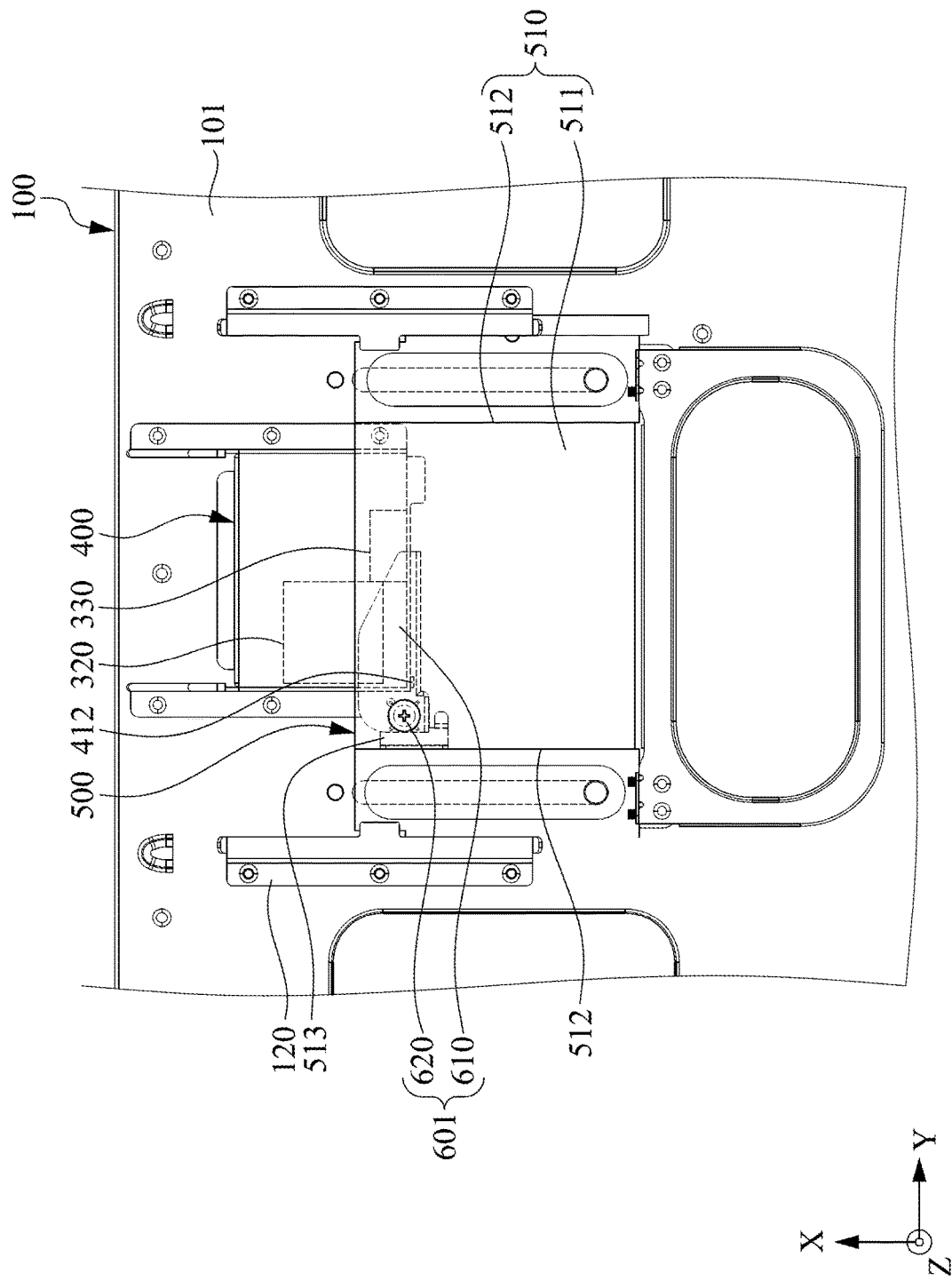
FIG. 7A to FIG. 7C are continuing operational views of the testing platform according to another embodiment of the present disclosure.
Figure 7B:
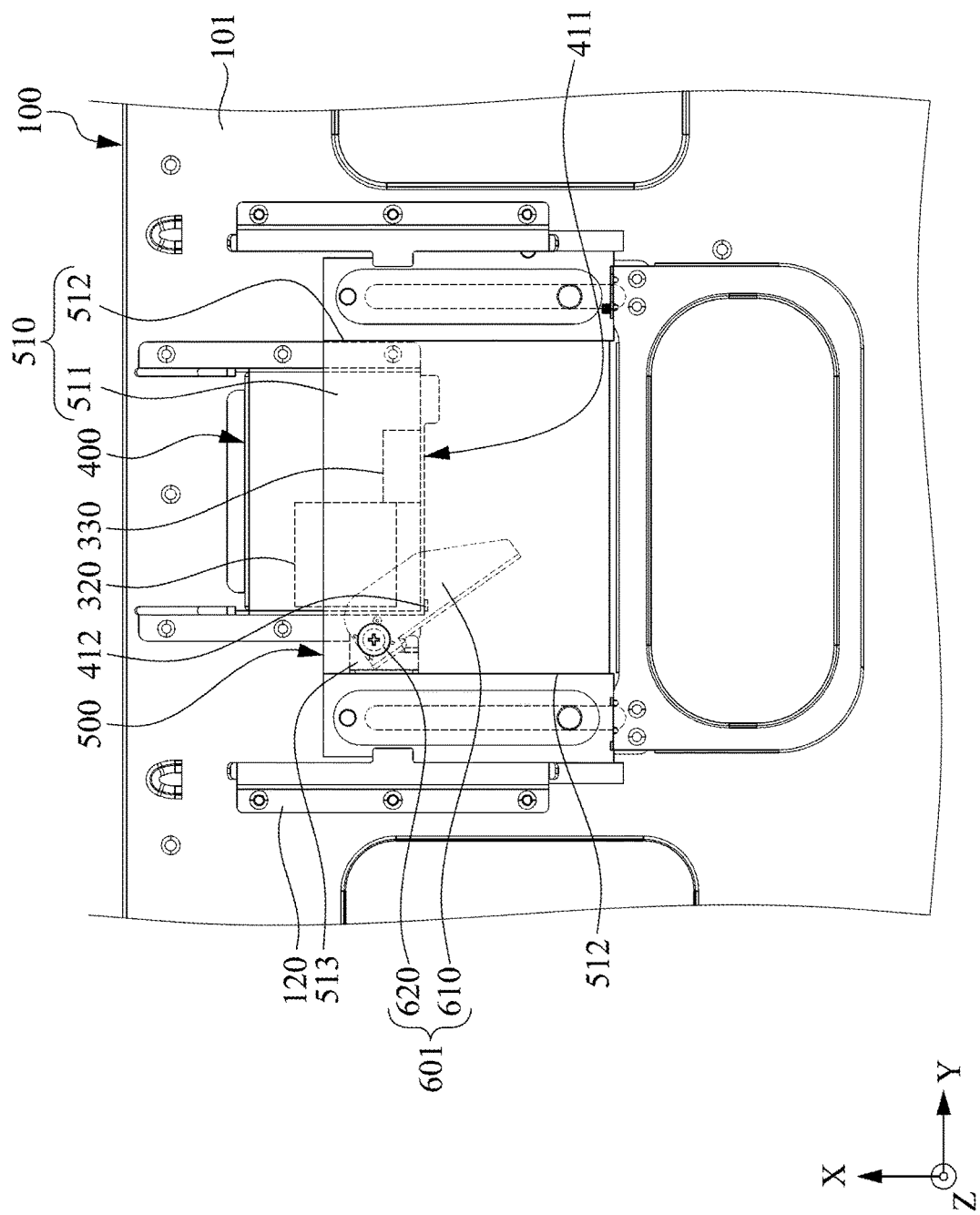
Figure 7C:
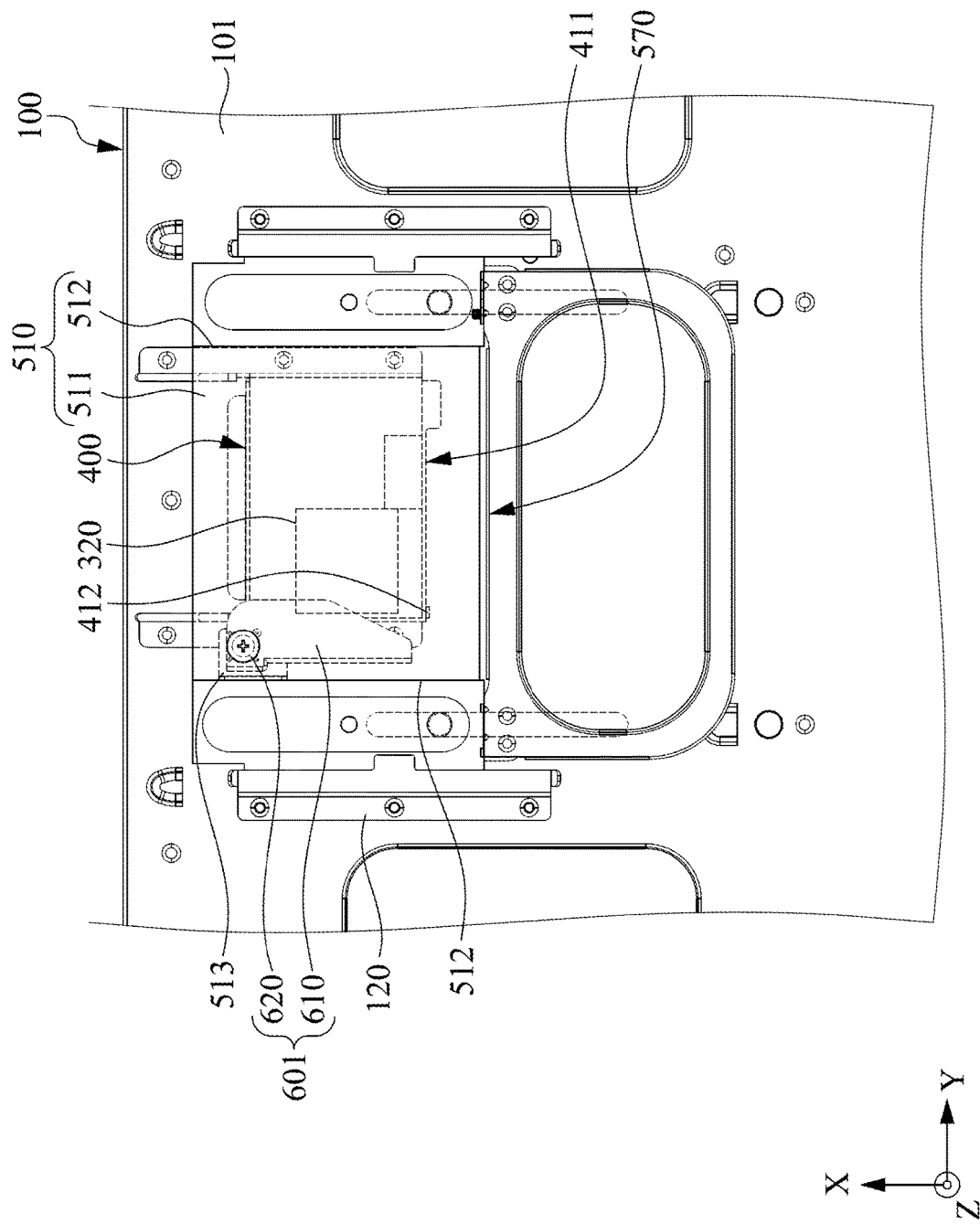
Figure 8:
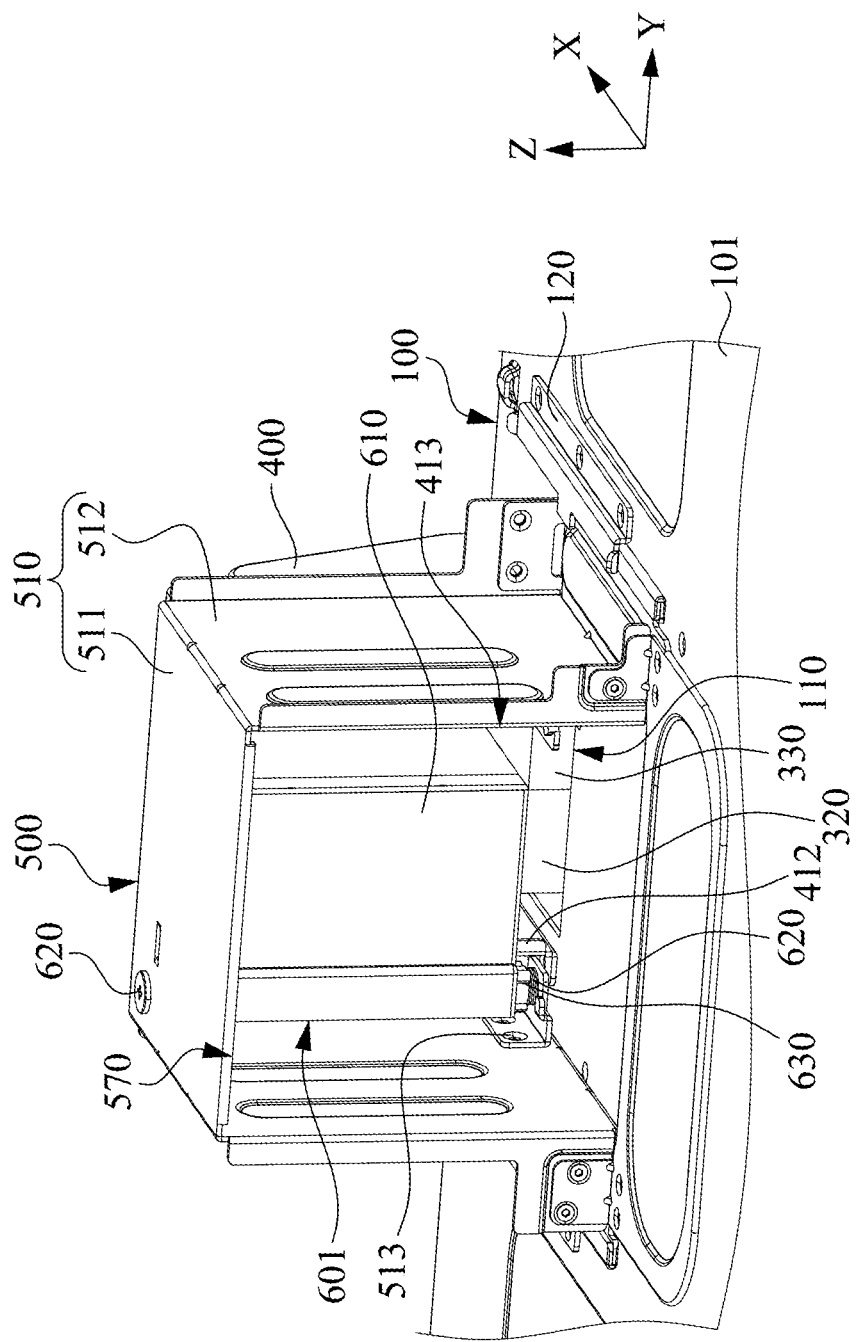
FIG. 8 is a front view of FIG. 7A.

Reference is now made to FIG. 6 to FIG. 8, in which FIG. 6 is an exploded view of a testing platform 11 according to another embodiment of the present disclosure. FIG. 7A to FIG. 7C are continuing operational views of the testing platform 11 according to another embodiment of the present disclosure. FIG. 8 is a front view of FIG. 7A. As shown in FIG. 6 and FIG. 7A, the testing platform 11 of this embodiment is substantially the same as the testing platform 10 of the above-mentioned embodiment, except that the rotation axis (e.g., Z axis) of the shielding door 601 in FIG. 6 and the rotation axis (e.g., Y axis) of the shielding door 600 in FIG. 3 are perpendicular to each other. In this embodiment, As shown in FIG. 6 and FIG. 7A, the shielding door 601 rotates about the vertical direction (e.g., Z axis) rather than the axial direction (e.g., Y axis), and the vertical direction (e.g., Z axis) and the aforementioned sliding direction (e.g., X axis) are perpendicular to each other.

As shown in FIG. 7A, the shielding door 601 is located within the sliding frame 500 and completely covers the entrance 411 of the fixed frame 401, so that the power interface 320 can be concealed in the fixed frame 401. More specifically, the pivotal portions 620 of the shielding door 601 are respectively pivotally connected to the top plate portion 511 and a pivoting bracket 513 of the shielding door 601 in the through channel 570. The pivoting bracket 513 is located within the through channel 570, and fixedly connected to an inner wall of one of the side plate portions 512. Furthermore, in the embodiment, the flange 412 of the fixed frame 401 protrusively extends outwardly from one of two opposite sides of the fixed frame 401 (see the area M shown in FIG. 6). However, as long as the shielding door 601 can be pushed to be rotated by the flange 412, the present disclosure is not limited to the number and shape of the flange 412.

As shown in FIG. 7B and FIG. 7C, when the device under test 700 pushes the rack body 510 so that the shielding door 601 can be rotated by the fixed frame 401, the door plate 610 of the shielding door 601 rotates outwardly about the vertical direction (e.g., Z axis), and one side of the door plate 610 facing away from the pivotal portions 620 begins to leave away from the entrance 411 of the fixed frame 400, so that the power interface 320 located in the fixed frame 400 is gradually exposed outwards from the entrance 411. Therefore, the power connector 720 of the device under test 700 (refer to FIG. 4B) is able to plug into the power interface 320 in the fixed frame 400 for receiving power supply from the power circuit 310 (FIG. 7C).

Thus, through the construction of the embodiments above, not only the power connector of the server unit can smoothly connect to the power interface of the testing device, but also the possibilities of dust or foreign objects entering the power interface of the testing platform can be decreased, and the possibilities of the maintenance personnel to be injured by accidentally touching the power interface can be reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A testing device with power protection, comprising:
    a power supply module having a power interface; and
    a testing platform comprising:
        a casing, wherein the power interface is disposed at one surface of the casing;
        a fixed frame receiving the power interface therein, and one side of the fixed frame being formed with an entrance that is able to expose the power interface outwards from the fixed frame; and
        a sliding frame comprising a rack body that is slidably located on the casing, and a shielding door that is rotatably connected to the rack body for covering the entrance of the fixed frame,
    wherein when the rack body is slid towards the power interface so that the shielding door is pushed to rotate away from the entrance by the fixed frame, the power interface is be exposed outwards from the fixed frame through the entrance.

2. The testing device with power protection of claim 1, wherein a through channel is collectively formed by the rack body and the casing, and the entrance of the fixed frame is disposed within the through channel.

3. The testing device with power protection of claim 2, wherein the shielding door comprises:
    two pivotal portions; and
    a door plate disposed within the through channel, covering the entrance of the fixed frame, and pivotally connected to the rack body through the two pivotal portions, respectively.

4. The testing device with power protection of claim 3, wherein the shielding door further comprises:
a torsion spring located on one of the two pivotal portions, and connected to the door plate and the rack body so as to provide a resilience force capable of moving the door plate to be rotated back to the entrance of the fixed frame.

5. The testing device with power protection of claim 3, wherein the rack body further comprises:
a top plate portion; and
two side plate portions respectively disposed on two opposite sides of the top plate portion and extending in a common direction, each of the two side plate portions being fixedly connected to the one surface of the casing, and the top plate portion facing towards the one surface of the casing,
wherein the through channel is defined by the top plate portion, the two side plate portions and the one surface of the casing, collectively, and the door plate is pivotally connected to the two side plate portions through the two pivotal portions, respectively, so that the door plate is rotatable about a rotary axis that is perpendicular to the common direction.

6. The testing device with power protection of claim 3, wherein the rack body further comprises:
a top plate portion;
two side plate portions respectively disposed on two opposite sides of the top plate portion and extending in a common direction, each of the two side plate portions being fixedly connected to the one surface of the casing, and the top plate portion facing towards the one surface of the casing, wherein the through channel is defined by the top plate portion, the two side plate portions and the one surface of the casing, collectively; and
a pivoting bracket disposed within the through channel, and connected to one of the two side plate portions,
wherein the door plate is pivotally connected to the top plate portion and the one side plate portion through the two pivotal portions, respectively, so that the door plate is rotatable about a rotary axis that is parallel to the common direction.

7. The testing device with power protection of claim 3, wherein the shielding door further comprises:
a load located at one end of the door plate facing away from the two pivotal portions so as to provide a gravity force capable of pulling downwardly the door plate to be rotated back to the entrance of the fixed frame.

8. The testing device with power protection of claim 1, wherein the casing comprises a sliding rail portion that is disposed on the one surface of the casing; and
the sliding frame comprises a sliding rib that is disposed on the rack body and slidably engaged with the sliding rail portion.

9. The testing device with power protection of claim 1, wherein the casing comprises a linear groove formed on the one surface of the casing; and
the sliding frame comprises a connecting post and a tension spring, the connecting post is connected to the rack body and slidably received within the linear groove, and the tension spring is connected to the connecting post and the casing so as to provide a resilience force capable of pushing the rack body away from the power interface.

10. The testing device with power protection of claim 1, further comprising:
a bottom case assembled to one side of the casing facing away from the fixed frame, and formed with a receiving space therein for receiving the power supply module,
wherein the one surface of the casing is formed with an opening, the opening is located inside the fixed frame, and the power interface extends into the fixed frame through the opening from the receiving space.

11. The testing device with power protection of claim 10, wherein the power supply module further comprises:
a power circuit disposed within the receiving space; and
a trigger switch electrically connected to the power circuit and the power interface, and extending into the fixed frame through the opening from the receiving space, wherein when the shielding door is pushed away from the entrance and the trigger switch is triggered at the same time, the power circuit starts to be electrically connected to the power interface.

12. A testing platform, comprising:
a casing for placing a power interface;
a fixed frame receiving the power interface, and one side of the fixed frame formed with an entrance that is able to expose the power interface outwards from the fixed frame; and
a sliding frame comprising a rack body that is slidably located on the casing, and a shielding door that is rotatably connected to the rack body for covering the entrance of the fixed frame,
wherein when the rack body is slid towards the power interface so that the shielding door is pushed to rotate away from the entrance by the fixed frame, the power interface is exposed outwards from the fixed frame through the entrance.

13. The testing platform of claim 12, wherein a through channel is collectively formed by the rack body and the casing, and the entrance of the fixed frame is disposed within the through channel.

14. The testing platform of claim 13, wherein the shielding door comprises:
two pivotal portions; and
a door plate disposed within the through channel, covering the entrance of the fixed frame, and pivotally connected to the rack body through the two pivotal portions, respectively.

15. The testing platform of claim 14, wherein the rack body further comprises:
a top plate portion; and
two side plate portions respectively disposed on two opposite sides of the top plate portion and extending in a common direction, each of the two side plate portions being fixedly connected to the one surface of the casing, and the top plate portion facing towards the one surface of the casing,
wherein the through channel is defined by the top plate portion, the two side plate portions and the one surface of the casing, collectively, and the door plate is pivotally connected to the two side plate portions through the two pivotal portions, respectively, so that the door plate is rotatable about a rotary axis that is perpendicular to the common direction.

16. The testing platform of claim 14, wherein the rack body further comprises:
a top plate portion;
two side plate portions respectively disposed on two opposite sides of the top plate portion and extending in a common direction, each of the two side plate portions being fixedly connected to the one surface of the casing, and the top plate portion facing towards the one surface of the casing, wherein the through channel is defined by the top plate portion, the two side plate portions and the one surface of the casing, collectively; and a pivoting bracket disposed within the through channel, and connected to one of the two side plate portions, wherein the door plate is pivotally connected to the top plate portion and the one side plate portion through the two pivotal portions, respectively, so that the door plate is rotatable about a rotary axis that is parallel to the common direction.

17. The testing platform with power protection of claim 14, wherein the shielding door further comprises:
a torsion spring located on one of the two pivotal portions, and connected to the door plate and the rack body so as to provide a resilience force capable of moving the door plate to be rotated back to the entrance of the fixed frame.

18. The testing platform of claim 14, wherein the shielding door further comprises:
a load located at one end of the door plate facing away from the two pivotal portions so as to provide a gravity force capable of pulling downwardly the door plate to be rotated back to the entrance of the fixed frame.

19. The testing platform of claim 12, wherein the casing comprises a sliding rail portion that is disposed on the one surface of the casing; and
the sliding frame comprises a sliding rib that is disposed on the rack body and slidably engaged with the sliding rail portion.

20. The testing platform of claim 12, wherein the casing comprises a linear groove formed on the one surface of the casing; and
the sliding frame comprises a connecting post and a spring, the connecting post is connected to the rack body and slidably received within the linear groove, and the spring is connected to the connecting post and the casing so as to provide a resilience force capable of pushing the rack body away from the power interface.

* * * * *